United States Patent [19]

Evans, Jr. et al.

[11] Patent Number: 5,051,950
[45] Date of Patent: Sep. 24, 1991

[54] READ/WRITE OPTICAL MEMORY

[75] Inventors: Joseph T. Evans, Jr.; Jeff A. Bullington, both of Albuquerque, N. Mex.

[73] Assignee: Radiant Technologies, Albuquerque, N. Mex.

[21] Appl. No.: 387,938

[22] Filed: Jul. 31, 1989

[51] Int. Cl.$^5$ .................. G11C 11/22; G11C 11/42
[52] U.S. Cl. ............................. 365/109; 365/112; 365/117
[58] Field of Search ................. 365/109, 112, 117

[56] References Cited

U.S. PATENT DOCUMENTS

3,868,653  2/1975  Winter .
3,973,247  8/1976  Kumada et al. .
4,041,477  8/1977  Drenckhan .

*Primary Examiner*—Terrell W. Fears
*Attorney, Agent, or Firm*—McCubbrey, Bartels, Meyer & Ward

[57] ABSTRACT

An improved read/write optical disk is disclosed which is capable of being rewritten more than $10^6$ times. The disk utilizes a storage medium in which data is stored as different polarization states in the same phase of the material. The preferred embodiment utilizes a lead lanthanum zirconate titanate material for the storage medium. The state of polarization of the material at the location of a specified data bit is changed by applying a voltage to the bit location in question. The location is specified by illuminating the surface of the disk with light in the infra-red.

10 Claims, 3 Drawing Sheets

READ/WRITE OPTICAL MEMORY

FIELD OF THE INVENTION

The present invention relates to data storage devices and more particularly to an optical disk which may be read or written a number of times.

BACKGROUND OF THE INVENTION

Optically read and written memory devices have the potential of providing a significant advance in the data storage capacity of computer systems and the like. In principle, data storage capacities of the order of $10^{12}$ bit/m$^2$ of storage media are possible with such devices. However, in spite of intense research and development work, optical read/write memories based on existing technologies are at best a marginal improvement over conventional magnetic memories.

The most attractive of the currently available read/write optical disks are based on magneto-optic materials. These disks have latency times of about 100 ms and may be rewritten only about $10^4$ times. For comparison, conventional magnetic hard disks used in computer systems may be rewritten more than $10^6$ times and have latency times less than 20 ms. In addition to poor latency times and insufficient rewrite capability, the intensity of laser light required to store the information in magneto-optical media is of the order of $10^5$ watts/cm$^2$. This high intensity results from the need to thermally modulate the magneto-optical media. To operate at these power densities, the laser diode used to write the magneto-optical media must operate near saturation. As a result, the lift-time of the laser diode is significantly reduced.

Most prior art magneto-optical media based memories have been constructed in the form of read/write optical disks. These disks are read by observing alterations in a laser beam which passes through the magneto-optical media. The preferred means of detecting the data is to observe the rotation of the polarization of the laser light after the light has passed through the media once, bounced off of a reflective coating on one side of the magneto-optical media, and then passed back through the media for a second time. As a result, the read/write head of the optical disk must include a laser diode for generating the light beam, a polarization analyzer, and a light detector. The weight of these components limits the seek time of the disk arm which further reduces the performance of such disk drives.

Another problem with prior art magneto-optical memories is the use of phase transitions for the storage of the information. In such memories, a bit of information is stored in a small area of the disk. One binary state corresponds to the media in this area being in a first phase while the other binary state corresponds to the media being in a second phase. The transition between states is induced either magnetically or optically. In either case, the magneto-optical media must be operated near a phase boundary. However, the location of the phase boundary is, in general, sensitive to environmental variables such as temperature, physical stress, and humidity. As a result, the optical memories are only operational in a narrow range of environmental variables. Such limitations have hampered the development of practical read/write optical disks.

Accordingly, it is an object of the present invention to provide an improved read/write optical disk.

It is a further object of the present invention to provide a read/write optical disk with lower latency times than currently available read/write optical disks.

It is yet another object of the present invention to provide a read/write optical disk which can be rewritten as many times as currently available magnetic hard disks.

It is a still further object of the present invention to provide a read/write optical disk which requires less power to write then prior art read/write optical disks.

It is a yet another object of the present invention to provide a read/write optical disk with a lighter weight reading mechanism than that of prior art read/write optical disks.

It is yet a still further object of the present invention to provide a read/write optical disk which does not require that the storage media be operated near a phase boundary.

These and other objects of the present invention will become apparent to those skilled in the art from the following detailed description of the invention and the accompanying drawings.

SUMMARY OF THE INVENTION

The present invention comprises a read/write optical memory which includes a substantially planar layer of ferroelectric material for storing data. The ferroelectric material has first and second polarization states in the same phase thereof. The first polarization state results from the application of a first electric field to said ferroelectric material, and the second polarization state results from the application of a second electric field to said ferroelectric material. The optical memory also includes a substantially planar layer of optically active material bonded to said layer of ferroelectric material for addressing a particular location on the ferroelectric sheet. The optically active material conducts electricity in the presence of light having a wavelength less than a first predetermined wavelength and is substantially an electrical insulator in the absence of said light. The dielectric constant of said material is substantially less than that of said ferroelectric material. The memory also includes a top electrode comprising a conducting coating bonded to the surface of said layer of optically active material on the surface thereof which is not bonded to said ferroelectric material and a bottom electrode comprising a conducting coating bonded to the surface of said layer of ferroelectric material on the surface thereof which is not bonded to said optically active material. At least one of said top and bottom electrodes is transparent to light of said first predetermined wavelength. A particular memory location is selected by directing a light beam of said first predetermined wavelength to a localized area on said optical addressing means. Data is written to the memory location so selected by applying either first and second potential differences between said top and bottom electrodes. The first potential difference is of a magnitude and direction such that said first potential difference would generate said first electric field in said layer of ferroelectric material if applied across said layer of ferroelectric material. Said second potential difference is of a magnitude and direction such that said second potential difference would generate said second electric field in said layer of ferroelectric material if applied across said layer of ferroelectric material.

BRIEF DESCRIPTION OF THE DRAWINGS

FIG. 2(a) illustrates the manner in which the polarization and index of refraction of the material used to construct a storage layer according to the present invention vary as a function of voltage differences applied there to. FIG. 2(b) illustrates the manner in which data is written into a memory structure according to one embodiment of the present invention.

DETAILED DESCRIPTION OF THE INVENTION

Figure 1A:
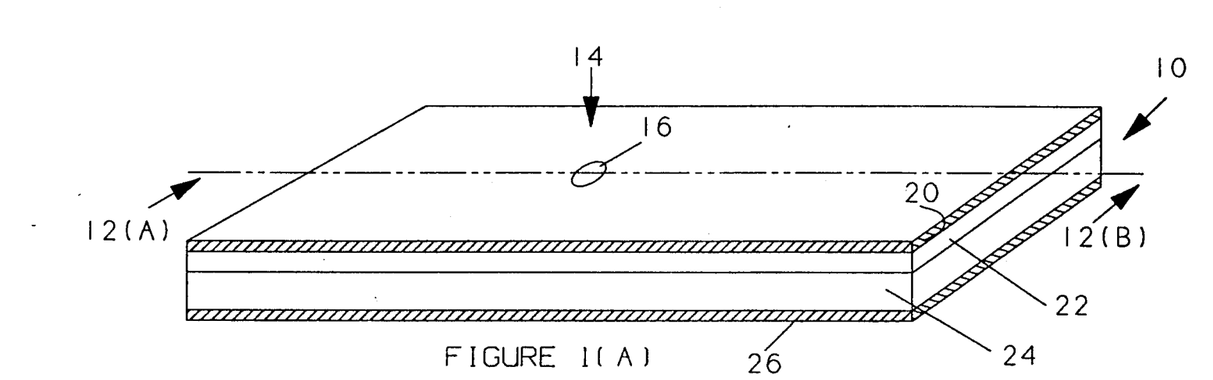
FIG. 1(a) is a perspective view of a memory structure according to the present invention.
Figure 1B:
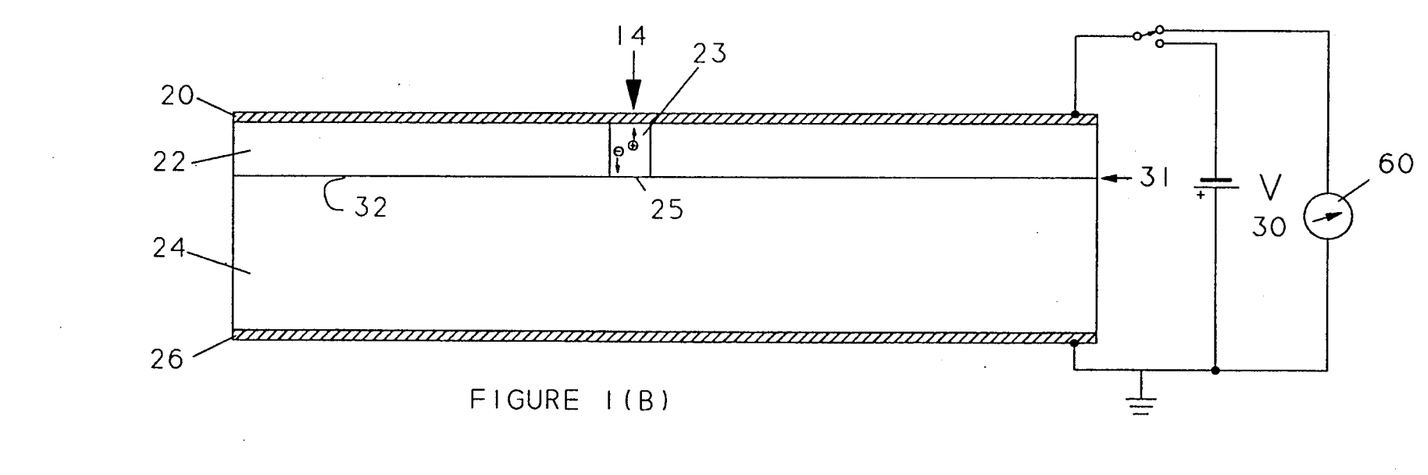
FIG. 1(b) is a cross-sectional view of the memory structure shown in FIG. 1(a).

The manner in which a memory according to the present invention is constructed and operated is more easily understood with reference to FIGS. 1(a)-(b). FIG. 1(a) is a prospective view of a memory structure 10 according to the present invention. FIG. 1(b) is a cross-sectional view of memory structure 10 taken through line 12a-12b. Memory structure 10 is a planar structure in which data bits are stored by altering the properties of the structure at various physical points thereon. The specific point is selected by directing a narrow beam of laser light 14 to the appropriate point on the surface of memory structure 10 thereby illuminating the location corresponding to the desired data bit. Such a spot of light is shown at 16.

Memory structure 10 comprises four substantially planar layers. The top layer comprises a first electrode 20 which is preferably transparent to light in the infrared. The second layer 22 will be referred to as an addressing layer. This layer is used in conjunction with the light beam 14 to select a particular storage location for writing. The third layer is used to store the actual data and will be referred to as storage layer 24. Finally, the fourth layer comprises a second electrode 26.

Storage layer 24 is preferably constructed from a storage material comprising a ferro-electric material such as lead lanthanum zirconate titanate (PLZT). In the preferred embodiment of the present invention, storage layer 24 is a perovskite structure of the form $ABO_3$ where the A site may be filled by either lead or lanthium and the B site may be filled with either zirconium or titanium. The preferred embodiment of the present invention utilizes a 2/65/35 composition. However, other compositions will be apparent to those skilled in the art.

Unlike prior art devices, the present invention utilizes changes in the polarization of the storage material rather than changes in the phase of the storage material. Here, a binary value of 1 is stored as one polarization state and that of 0 is stored as a second polarization state. Both of the polarization states in question are within the same perovskite phase. It has been found experimentally that the state of polarization may be switched more than $10^6$ times without loss of function. Hence, the present invention represents a significant improvement over prior art read/write disks which show degradation in performance after only $10^4$ write operations.

Figure 2A:
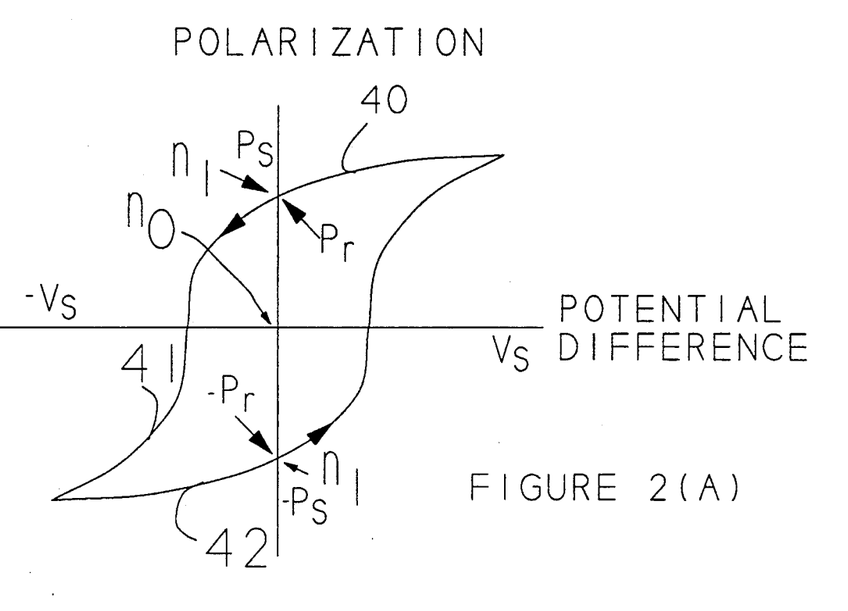

The manner in which data is stored in storage layer 24 is more easily understood with reference to FIGS. 2(a)-(b) which illustrate the polarization of the PLZT material used to construct storage layer 24 as a function of the voltage across the material in question. The voltage differences in question generate electric fields in storage layer 24. Referring to FIG. 2(a), there is a potential difference $V_s$ above which no increase in the polarization of the material will take place. If a sample of the material is subjected to such a voltage and the voltage then removed, the polarization of the sample will decrease along curve 40 to a value $P_r$, referred to as the remnant polarization. The index of refraction of the material at this point will be referred to as $n_1$.

If the sample in question is now subjected to a voltage difference of $-V_s$, the polarization of the sample will be reversed, reaching a value of $-P_S$ by traveling along curve 41. If the voltage across the sample is now removed, the polarization of the sample will decrease to $-P_r$ along curve 42. The index of refraction of the material depends on the absolute value of the polarization; hence the index of refraction of the sample at this point is also $n_1$.

To construct a memory in which data is read by observing a rotation in the polarization of a laser beam, the two binary data states must have different indices of refraction. Ideally, one would like to have the maximum possible difference in index of refraction between the states representing a one and a zero, respectively. The two states having the maximum difference in index of refraction when no voltage is applied to the PLZT material are the state in which the PLZT material has an index of refraction of $n_0$ (polarization equal to zero) and one of the states in which the index of refraction is $n_1$ (polarization equal to $\pm P_r$). For the purposes of this discussion, the state with polarization $-P_r$ will be used. This state will be assumed to represent a binary one. The state with zero polarization will be defined to represent a binary one.

To write a binary one, a voltage difference of $-V_S$ to the sample which causes the polarization to change as shown by curve 48. This voltage is then removed which causes the polarization to change as shown by curve 50 in FIG. 2(b). At this point, a binary one is stored in the material. To store a binary zero, a positive voltage of $V_C$ is applied to the sample which causes the polarization to increase as shown on curve 51. $V_C$ is approximately equal to $V_S/2$ for the above mentioned PLZT materials. Upon removing this positive voltage, the polarization will return to a value of substantially zero along curve 52. At this point, the material has an index of refraction of $n_0$ and a data value corresponding to a binary zero will be stored. Because of the hysteresis of the material, a binary zero may only rewritten after the material has been first set to the binary one state.

Since the binary data values have different indices of refraction, the value stored at any given time may be ascertained by observing the rotation of the plane of polarization of laser light passing through the portion of the storage structure corresponding to the data bit in question. The device may be re-written at any time by first storing a one and then, if necessary, storing a zero.

Addressing layer 22 in conjunction with light beam 14 are used to select the physical location at which data is written into storage layer 24. Addressing layer 22 must have two properties. First, in the absence of light having a wavelength shorter than that of light beam 14, addressing layer 22 must be an insulator with a dielectric constant which is much smaller than that of storage layer 24. In this regard, it will be assumed for the purposes of this discussion that storage layer 24 is an insulator. As a result, any potential difference V applied between electrodes 20 and 26 by battery 30 will appear primarily across addressing layer 22. That is, the potential of the top surface 31 of storage layer 24 will be substantially equal to ground.

Second, addressing layer 22 must be photoconductive in the presence of light having a wavelength less than or equal to that of light beam 14. In the preferred embodiment of the present invention, this wavelength is selected to be in the infra-red. Light beams of these wavelengths are easily obtained utilizing laser diodes.

Assuming that addressing layer 22 has the above mentioned properties, voltage can be applied to a localized area of storage media 24 by exposing the surface of addressing layer 22 directly above the area in question to light beam 14. In this case, light beam 14 will cause the portion 23 of addressing layer 22 so illuminated to become photoconductive. The holes and electrons so created will conduct the voltage present on electrode 20 to the surface of storage layer 24 as shown at location 25. In effect, addressing layer 22 will be locally shorted out. As a result, the voltage difference supplied by battery 30 will now appear across storage layer 24 at location 25. Other areas of storage layer 24 such as location 32 will remain at essentially ground potential. Hence, the voltage difference will only appear across the area corresponding to the selected data bit.

Storage layer 24 and addressing layer 22 may be deposited on a suitable substrate using sputtering, chemical vapor deposition or sol gel deposition. The preferred method of deposition is the conventional sol gel deposition technique. In this technique, a solution of the PLZT material is spun onto the substrate. The solution consists of a solvent carrying a metal organic complex which has been partially gelled into long chains. The chains consist of a linear array of metal atoms alternating with oxygen atoms and coordinated with hydrocarbon groups along the outside of the linear array. The chains are normally formed by hydrolysis of alkoxides which are individual metal atoms bonded to the hydrocarbons. The alkoxides are mixed to produce the desired ratio of metal atoms in the final ceramic and then water is added to the mixture. The water hydrolyzes the individual alkoxide molecules into the chains which remain suspended in the solvent. In this way, metal oxide molecules are dissolved in solvents such as simple alcohols.

The sol gel is spun onto the substrate using a conventional spinning apparatus. The solvent evaporates during the spinning, leaving the surface of the substrate coated with metal organic chains. The substrate is then heated gradually to evaporate the remaining solvent. After the solvent has been evaporated, the coated substrate is heated further to break the hydrocarbon bonds. As a result, hydrogen, carbon and oxygen are released, leaving a coating of metals and oxygen. The substrate is then raised to a temperature which sinters the amorphous layer into its ceramic form. For PLZT, the hydrocarbons evaporate below 400 degrees Centigrade. The substrate is then heated to a temperature above 550 degrees Centigrade for at least 20 minutes to form a perovskite phase ceramic.

If the sintering takes place between 400 and 500 degrees centigrade, a pyrochlore structure will be formed. Such a structure has a dielectric constant below 50 and is only paraelectric as opposed to the perovskite structure which is ferroelectric. If lower concentrations of lead are used, a layer having an even lower dielectric constant is obtained. Low temperature sintering of a PLZT material can provide the low dielectric constant in question.

It will be apparent to those skilled in the art that the exact temperatures at which the perovskite phase will be formed will vary somewhat with the substrate and sol gel composition. The above protocol is given only as an example.

The thickness of the layer deposited by one spin is determined by the viscosity of the gel, the spin speed, and the composition of the gel. If too thick a layer is deposited, the layer will crack during sintering. Hence, the preferred thickness is from 0.05 microns to 0.15 microns. Thicker films are fabricated by depositing multiple layers.

The sol gel process can be used to fabricate both addressing layer 22 and storage layer 24. In the preferred embodiment, storage layer 24 is first deposited on the substrate using the appropriate number of layers to provide the desired thickness. Storage layer 24 is then sintered. The thickness needed will depend on the optical rotation needed during the reading process. A thickness of 1 micron is normally sufficient. The addressing layer 24 is then fabricated by depositing a layer of the desired material together with a dopant to provide photosensitivity in the desire wavelength range. The addressing layer is sintered separately to prevent the dopant from diffusing into the storage layer.

The dielectric constant of the addressing layer can be reduced in several ways. As noted above, the addressing layer can be sintered to a lower temperature which prevents a perovskite structure from forming. Alternatively, sufficient dopant can be added to the PLZT material to prevent the perovskite structure from forming. The perovskite storage medium will, in general, have a dielectric constant of approximately 500 to 2000. A PLZT pyrochlore phase material will have a dielectric constant of typically 20 to 50.

The dielectric constant may also be varied by choosing a different composition of PLZT material. For example, a composition of 0/0/100, i.e., lead titanate has a dielectric constant of about 100; whereas, a composition of 8/40/60 has a dielectric constant of about 700.

The photo-sensitivity of the addressing layer will be determined by the dopant chosen and the concentration thereof in the addressing layer. Of infra-red sensitivity, the dopant needs to trap electrons in a potential well which is less than 1 ev in energy below the conduction band of the PLZT material. Neodymium doped PLZT exhibits such trapping. The performance of such a material for the addressing layer is very insensitive to the concentration of Neodymium. Concentration levels from $10^{20}$ atoms per $cm^3$ to as high as 3 atomic % will provide the desired photosensitivity. The wide range of dopant concentration makes PLZT the preferred base material for the addressing layer.

The embodiment of the present invention described above utilizes a conventional polarization reading mechanism to read the data stored in the storage layer. That is, the storage layer is illuminated with a plane-polarized laser beam and the rotation of the plane of polarization detected. Since the state corresponding to a binary one has a different index of refraction than that corresponding to a binary zero, the plane of polarization will be rotated by different amounts depending upon the stored data. A polarization analyzer is used to differentiate between the different degrees of rotation.

Such detection systems require a heavy complex system of lenses, beam splitters, analyzers, and detectors. The weight of this assembly reduces the speed with which the read head of an optical disk can be moved between tracks on the disk. As a result of this weight, read/write optical disks have not been able to compete with conventional magnetic hard disks in terms of access speed.

A second embodiment of the present invention provides a reading system which does not depend on detecting laser light, and hence, does not require that a heavy lens assembly be positioned over the track to read the data. This embodiment of the present invention is based on the observation that ferroelectric materials produce a photo-generated current when exposed to light. The ferroelectric material must be photovoltaic at the wavelength in question. That is, the material must generate sufficient carriers for the carriers to be forced out of the material by the remnant field resulting from the polarization of the material.

Undoped PLZT materials are known to have a bandgap energy of 0.35ev, causing carrier generation at wavelengths below 0.36 microns. Alternatively, the ferroelectric may be doped as described above with reference to addressing layer 22 to provide the desired property at longer wavelengths. Since it is advantageous to utilize lasers in the infra-red region, the material is preferably doped.

The degree of doping is preferably much less than that used in addressing layer 22. If storage layer 24 were of the same or greater conductivity than addressing layer 22, then a electrodes 20 and 26 would be shorted during a write operation such as described above. In this case, no voltage difference would appear across storage layer 24. This would lead to a device which could not be written by the mechanism described above.

Alternatively storage layer 24 can be doped to become photo-conductive at a shorter wavelength than that at which addressing layer 22 becomes photo-conductive. In this case, data would be written using the longer wave-length light to address the bit location. To read the data, the bit location would be illuminated with the shorter wave-length light. Since the addressing layer 22 will also be photo-conducting at this shorter wave-length, the photo-current generated in the polarized storage layer will be able to flow through the addressing layer to electrode 20.

For example, a memory which is written by light in the infra-red and then read utilizing light in the blue wave lengths may be constructed by doping storage layer 24 with aluminum, iron, or chromium. Addressing layer 22 would be preferably doped with Neodymium in this case.

The direction of the photo-generated current is determined by the direction of polarization. The current is proportional to the degree of polarization. Hence, the state of polarization of any location in the storage layer may be determined by measuring the current that flows between electrodes 20 and 26 when the location in question is illuminated with light.

The manner in which data is written to storage layer 24 is somewhat different in this embodiment of the present invention than that discussed above with reference to FIG. 2(b). In this embodiment of the present invention, a maximum difference in the polarization of the two states representing one and zero is preferred rather than a maximum difference in indices of refraction. To write a binary one, a voltage of $-V_S$ is placed across electrodes 20 and 26 and the bit location illuminated with a laser beam of a wave length which causes addressing layer 22 to become photo-conductive. The voltage is then removed, leaving the bit location with a remnant polarization of $-P_r$. To write a binary zero, a similar procedure is employed; however, the voltage placed across the electrodes is $V_S$ instead of $-V_S$. As a result, the bit location will be left with a remnant polarization of $P_r$.

To read the data, the bit location is illuminated with light which causes both the addressing layer 22 to become photo-conductive and the storage layer 24 to generate a voltage and current spike. The direction of the photo-generated current is detected using a current sensor such as sensor 60 shown in FIG. 1(b). During the read operation, voltage source 30 is disconnected. In a rotating optical disk memory system, sensor 60 is preferably connected to electrodes 20 and 26 via a sliding contact at the hub of the disk assembly.

The above described electrical reading scheme allows thinner storage layers 24 to be utilized. If the memory system is to be read by observing the change in the plane of polarization of light, storage layer 24 must be thick enough to provide a measurable change in the polarization plane between the two index of refraction states. This requires a layer which is of the order of 1 micron in thickness. In the electrically read embodiment of the present invention, the thickness of storage layer 24 is determined only by the minimum photo-current that can be detected. Hence, much thinner films can be utilized.

Thinner storage layers are easier to fabricate, since they require the application of fewer layers of material. In addition, the voltage differences needed to generate an electric field of sufficient strength to change the state of polarization of the material are reduce. Finally, thick storage layers may trap charge therein. The trapped charge causes space charge effects which interfere with writing information into the storage layer. Thin storage layers avoid this problem, since any photocarriers generated in the storage layer will be ejected therefrom.

Yet another advantageous of the present invention lies in a reduction in the distance between the surface of the disk and the head which carries the laser used for addressing a specific location on the optical disk. Prior art devices which utilize a phase change to write the storage media, require larger laser diodes and bulky optical assemblies. Power densities of the order of 50,000 watts/cm$^2$ are required for changing the phase of the materials in such devices. To achieve these power densities, large area laser diodes are utilized. The emitting area is then imaged onto the storage material to form a spot of the order of 1 micron with the required power density. This imaging requires a long focal length lens and a significant distance between the laser diode and the storage media. This distance complicates the task of tracking on the disk.

In contrast, the present invention requires power densities of the order of 100 milliwatts/cm$^2$. This power density can be provided without the need for imaging the light from a large surface area laser diode. In fact, surface emitting laser diodes which do not require any imaging may be utilized. Hence, the distance between the storage material and the laser diode is much smaller with the present invention. This simplifies tracking operations.

Figure 3:
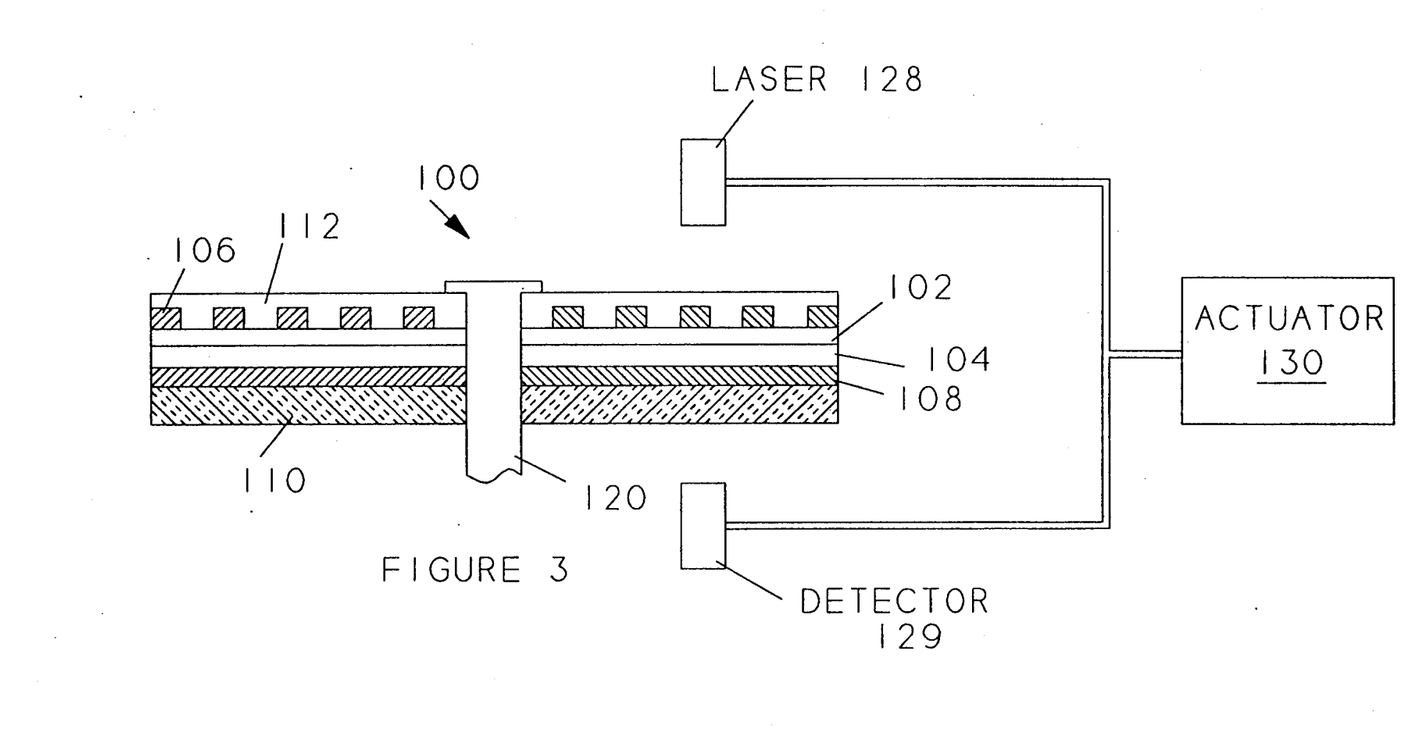
FIG. 3 is a cross-sectional view of a storage platter for use in a rotating disk memory according to the present invention.

FIG. 3 is a more detailed cross-sectional view of a "platter" 100 for an optical read/write disk according to the present invention. Platter 100 is similar to the structures discussed above with reference to FIGS. 1(a)-(b) in that it includes a storage layer 102, addressing layer 104, and two electrodes 106 and 108 which serve the same functions as storage layer 24, addressing layer 22, and electrodes 20 and 26 discussed above. These layers are deposited on a substrate 110 which provides physical strength to the platter. A passivation layer 112 is deposited on top of electrode 106 to protect the top surface of platter 100. Platter 100 is preferably circular in shape and rotates under the reading mechanism about a shaft 120.

Platter 100 differs from that shown in FIGS. 1(a)-(b) in that electrode 108 is grooved. It is known in the prior art that it is advantageous to provide grooves in the platter to facilitate positioning of the read/write head over the platter. In prior art systems, the grooves are make by notching the substrate. Such notching would be disadvantageous in an optical disk according to the present invention since notches in the upper surface of substrate 100 would cause deformities in the various electrodes and layers. Such deformities would result in non-uniform electric fields in the storage layer which would, in turn, interfere with the operation of the disk.

The present invention avoids these problems by providing the grooves in the top electrode 106. The grooves in question may be constructed by etching electrode 106 to produce a series of concentric rings which are joined by a common spoke to provide electrical connections therebetween. The common spoke has been omitted from FIG. 3 for clarity. This configuration provides a second benefit in that the capacitance of top electrode 106 is substantially reduced thereby reducing the time needed to switch voltages onto electrodes 106 and 108.

There are two configurations in which data is to be read by observing the rotation of the polarization plane of a light beam. In the first configuration, the light source and the detector are on the same side of the platter. For example, if the source and detector are on the top side of platter 110, i.e., above electrode 106, electrode 106 and passivation layer 110 must be transparent to the laser light utilized for the read and write operations and electrode 108 or substrate 110 must be reflective. If the light source and detector are located on the under side of platter 100, then substrate 110, electrode 108, storage layer 104 and addressing layer 102 must be transparent to the laser light. In this case, electrode 106 must be reflective.

In the second configuration shown in FIG. 3, the detector 129 is located on the opposite side of platter 100 from the light source 128. An actuator 130 is used to position light source 128 and detector 129 relative to the surface of platter 100. In this case all of the layers must be transparent to the laser light in question.

If the electrical read method described above is to be utilized, only those layers between the light source and addressing layer 102 need by transparent.

Platter 100 is constructed as follows: The substrate material and electrode materials are chosen to be compatible with the reading scheme to be used. The substrate material must be able to withstand the processing temperatures and is preferably light weight. Light weight ceramics such as $AlO_3$ are preferred. A hole is made in the substrate for the rotation shaft. The metal film for electrode 108 is then deposited on the substrate. If electrode 108 is to be transparent, a metal oxide is utilized. Conventional semiconductor processing techniques such as chemical vapor deposition, sputtering, etc. may be utilized to deposit the layer in question.

The storage layer 104 is then deposited on the electrode 108. The sol gel technique described above may be utilized for this purpose. Other deposition techniques such as those used in conventional semiconductor processing may be also be utilized for depositing the material.

Addressing layer 102 is deposited, followed by electrode 106. Electrode 106 is preferably patterned with the grooves therein. This may be accomplished by conventional photo-resist deposition techniques or by photo-resist etching of a uniform electrode layer. Finally, passivation layer 110 is deposited.

The preferred passivation layer is a 300 to 400 angstrom silicon nitride layer. Silicon nitride is preferred because it protects the structure from moisture.

While the above described embodiments of the present invention have been described with reference to a storage layer which is constructed from a ferroelectric such as the perovskite phase of PLZT, it will be apparent to those skilled in the art that other ferroelectric materials be utilized. PLZT materials are preferred because of the ease of manufacturing these material and their fast switching times. The important feature of the present invention lies in the use of two different polarization states within the same phase for the storage of data.

Similarly, the present invention has been described with reference to Neodymium as the doping agent for the addressing layer. Other doping agents will be apparent to those skilled in the art. For example, gallium, silicon, platinum silicide, lead silicide, indium phosphide, and lead oxide may also be utilized. The specific dopant will determine the maximum wave-length of the light used to read and write the memory.

There has been described herein a read/write optical memory. Various modifications to the present invention will become apparent to those skilled in the art from the foregoing description and accompanying drawings. Accordingly, the present invention is to be limited solely by the scope of the following claims.

What is claimed is:

1. A read/write optical memory comprising
   storage means comprising a substantially planar layer of ferroelectric material, said ferroelectric material having first and second polarization states in the same phase thereof, said first polarization state resulting from the application of a first electric field to said ferroelectric material and said second polarization state resulting from the application of a second electric field to said ferroelectric material, the magnitude of the polarization of said ferroelectric material in said first state being different from the magnitude of the polarization of said ferroelectric material in said second state;
   optical addressing means comprising a substantially planar layer of optically active material bonded to said layer of ferroelectric material, said optically active material conducting electricity in the presence of light having a wavelength less than a first predetermined wave length and substantially being an electrical insulator in the absence of said light, the dielectric constant of said material being substantially less than that of said ferroelectric material;

top electrode means comprising a conducting coating bonded to the surface of said layer of optically active material on the surface thereof which is not bonded to said ferroelectric material;

bottom electrode means comprising a conducting coating bonded to the surface of said layer of ferroelectric material on the surface thereof which is not bonded to said optically active material, wherein at least one of said top and bottom electrodes is transparent to light of said first predetermined wavelength;

means for directing a light beam of said first predetermined wavelength to a localized area on said optical addressing means; and means for applying first and second potential differences between said top and bottom electrodes, said first potential difference being of a magnitude and direction such that said first potential difference would generate said first electric field in said layer of ferroelectric material if applied across said layer of ferroelectric material and said second potential difference being of a magnitude and direction such that said second potential difference would generate said second electric field in said layer of ferroelectric material if applied across said layer of ferroelectric material.

2. The read/write optical memory of claim 1 wherein said ferroelectric material comprises a Lead Lanthanum Zirconate Titante.

3. The read/write optical memory of claim 1 wherein said first predetermined wavelength is greater than 0.5 microns.

4. The read/write optical memory of claim 1 wherein said optically active material comprises a compound or element chosen from the group enodymium, gallium, silicon, platinum silicide, lead silicide, indium phosphide, and lead oxide.

5. The read/write optical memory of claim 1 wherein said storage means comprises material in a perovskite phase.

6. A read/write optical memory comprising
storage means comprising a substantially planar layer of ferroelectric material, said ferroelectric material having first and second polarization states in the same phase thereof, said first polarization state resulting from the application of a first electric field to said ferroelectric material and said second polarization state resulting from the application of a second electric field to said ferroelectric material;

optical addressing means comprising a substantially planar layer of optically active material bonded to said layer of ferroelectric material, said optically active material conducting electricity in the presence of light having a wavelength less than a first predetermined wavelength and substantially being an electrical insulator in the absence of said light, the dielectric constant of said material being substantially less than that of said ferroelectric material;

top electrode means comprising a conducting coating bonded to the surface of said layer of optically active material on the surface thereof which is not bonded to said ferroelectric material;

bottom electrode means comprising a conducting coating bonded to the surface of said layer of ferroelectric material on the surface thereof which is not bonded to said optically active material, wherein at least one of said top and bottom electrodes is transparent to light of said first predetermined wavelength;

means for directing a light beam of said first predetermined wavelength to a localized area on said optical addressing means;

reading means for illuminating a localized area on said storage means and the area of said addressing means adjacent thereto with a light beam of a second predetermined wavelength;

means for detecting a current flow between said top and bottom electrodes in response to said reading means illuminating said storage means; and means for applying first and second potential differences between said top and bottom electrodes, said first potential difference being of a magnitude and direction such that said first potential difference would generate said first electric field in said layer of ferroelectric material if applied across said layer of ferroelectric material and said second potential difference being of a magnitude and direction such that said second potential difference would generate said second electric field in said layer of ferroelectric material if applied across said layer of ferroelectric material, wherein said ferroelectric material comprises an optically active material, which generates an electrical current when exposed to a light of a second predetermined wavelength, said second predetermined wavelength being less that or equal t said first predetermined wavelength.

7. The read/write optical memory of claim 6 wherein said second predetermined wavelength is substantially equal to said first predetermined wavelength and the resistivity of said ferroelectric material when exposed to light of said second predetermined wavelength is substantially greater than the resistivity of said optically active material in said optical addressing means when exposed to light of said second wavelength.

8. The read/write optical memory of claim 1 further comprising:
substrate means bonded to said bottom electrode for supporting said storage means; and
surface protection means bonded to said top electrode for isolating said top electrode from environmental exposure.

9. The read/write optical memory of claim 1 wherein said top electrode further comprises optical locating means for positioning said light directing means with respect to said optical addressing means.

10. The read/write optical memory of claim 9 wherein said locating means comprises grooves extending through said top electrode.

* * * * *

UNITED STATES PATENT AND TRADEMARK OFFICE
CERTIFICATE OF CORRECTION

PATENT NO. : 5,051,950
DATED : September 24, 1991
INVENTOR(S) : Evans, et al.

It is certified that error appears in the above-identified patent and that said Letters Patent is hereby corrected as shown below:

IN THE TITLE [54], delete "Read/Write Optical Memory" and insert therefor --An Improved Read/Write Optical Memory--.

Column 1, line 26, after "times" insert --of--.

Column 1, line 34, delete "lift-time" and insert therefor --lifetime--.

Column 2, line 12, after "is" delete "a".

Column 3, line 48, delete "by" and insert therefor --with--.

Column 3, line 50, delete "titantium" and insert therefor --titanium--.

Column 4, line 9, after "voltage" insert --is--.

Column 4, line 37, delete "one" and insert therefor --zero--.

Column 4, line 38, after "-$V_S$" insert --is applied--.

Column 4, line 52, after "only" insert --be--.

Column 4, line 53, delete "been first" and insert therefor --first been--.

Column 6, line 25, delete "24" and insert therefor --22--.

Column 6, line 47, delete "Of" and insert therefor --For--.

Column 6, line 63, after "polarization" insert --is--.

Column 6, line 64, delete "than" and insert therefor --from-.

Column 7, line 32, after "then" delete "a".

Column 7, line 45, delete "photo-conducting" and insert therefor --photoconductive--.

UNITED STATES PATENT AND TRADEMARK OFFICE
CERTIFICATE OF CORRECTION

PATENT NO. : 5,051,950

DATED : September 24, 1991

INVENTOR(S) : Evans, et al.

It is certified that error appears in the above-identified patent and that said Letters Patent is hereby corrected as shown below:

Column 7, line 64, delete "than" and insert therefor --from--.

Column 8, line 2, after "location" insert --is--.

Column 8, line 38, delete "reduce" and insert therefor --reduced--.

Column 8, line 44, delete "advantageous" and insert therefor --advantage--.

Column 8, line 48, after "write" insert --to--.

Column 9, Lines 5 and 6, delete "storage layer 102, addressing layer 104," and insert therefore --storage layer 104, addressing layer 102,--.

Column 9, line 20, delete "make" and insert therefor --made--.

UNITED STATES PATENT AND TRADEMARK OFFICE
CERTIFICATE OF CORRECTION

PATENT NO.  : 5,051,950
DATED       : September 24, 1991
INVENTOR(S) : Joseph T. Evans, Jr., et al It is certified that error appears in the above-identified patent and that said Letters Patent is hereby corrected as shown below:

Column 9, line 60, delete "by" and insert therefor --be--.

Column 10, line 22, after "ferroelectric" insert --material--.

Column 10, line 26, delete "material" and insert therefor --materials--.

Column 12, line 37, delete "t" and insert therefor --to--.

Column 10, line 9, delete "be also" and insert therefor --also be--.

Column 12, line 37, delete "less that" and insert therefor --less than--.

Signed and Sealed this

Ninth Day of March, 1993

*Attest:*

STEPHEN G. KUNIN

*Attesting Officer*            *Acting Commissioner of Patents and Trademarks*